United States Patent [19]

Wheatley, III et al.

[11] Patent Number: 5,283,536

[45] Date of Patent: Feb. 1, 1994

[54] HIGH DYNAMIC RANGE CLOSED LOOP AUTOMATIC GAIN CONTROL CIRCUIT

[75] Inventors: Charles E. Wheatley, III, Del Mar; Derek N. Punch, San Diego, both of Calif.

[73] Assignee: Qualcomm Incorporated, San Diego, Calif.

[21] Appl. No.: 48,559

[22] Filed: Apr. 16, 1993

Related U.S. Application Data

[63] Continuation of Ser. No. 871,529, Apr. 21, 1992, abandoned, which is a continuation of Ser. No. 620,092, Nov. 30, 1990, Pat. No. 5,107,225.

[51] Int. Cl.$^5$ ............................................. H03G 3/30
[52] U.S. Cl. ...................................... 330/279; 330/129
[58] Field of Search ............. 330/279, 129, 133, 134, 330/141, 302, 310, 281; 455/239, 241, 251

[56] References Cited

U.S. PATENT DOCUMENTS

| | | | |
|---|---|---|---|
| 3,469,195 | 9/1969 | Harwood | 325/405 |
| 3,665,507 | 5/1972 | Pell | 325/315 |
| 3,886,380 | 5/1975 | Sobajima et al. | 307/237 |
| 4,054,849 | 10/1977 | Yamada | 333/14 |
| 4,223,274 | 9/1980 | Paulke et al. | 330/133 |
| 4,263,560 | 4/1981 | Ricker | 330/129 |
| 4,380,711 | 4/1983 | Cunningham | 307/491 |
| 4,426,625 | 1/1984 | Harwood et al. | 330/254 |
| 4,514,702 | 4/1985 | Zogg | 330/254 |
| 4,602,218 | 7/1986 | Vilmur et al. | 330/279 |
| 4,607,234 | 8/1986 | Nordholt et al. | 330/278 |
| 4,816,772 | 3/1989 | Klotz | 330/254 |
| 5,107,225 | 4/1992 | Wheatley et al. | 330/279 |

FOREIGN PATENT DOCUMENTS 59-97213  6/1984  Japan .

Primary Examiner—Steven Mottola
Attorney, Agent, or Firm—Russell B. Miller; Katherine W. White

[57] ABSTRACT

A closed loop automatic gain control (AGC) circuit with high dynamic range capabilities having an amplifier circuit for receiving an input signal, which is susceptible to variations in signal power, and a control signal. The amplifier circuit is responsive to the control signal for amplifying the input signal at a gain level corresponding to the control signal so as to provide a corresponding output signal. A measurement circuit is coupled to the amplifier means for measuring logarithmic signal power of the amplified input signal and providing a corresponding linear measurement signal. An integration circuit is included for receiving the measurement signal, and a reference signal which corresponds to a desired signal power of the output signal. The integration circuit integrates with respect to time the difference between the measurement signal and the reference signal, and generates the control signal which corresponds to the result of the integration.

15 Claims, 3 Drawing Sheets

HIGH DYNAMIC RANGE CLOSED LOOP AUTOMATIC GAIN CONTROL CIRCUIT

This is a continuation of application Ser. No. 07/871,529, filed Apr. 21, 1992, now abandoned, which is a continuation of application Ser. No. 07/620,092, filed Nov. 30, 1990, now U.S. Pat. No. 5,107,225 issued Apr. 21, 1992.

BACKGROUND OF THE INVENTION

I. Field of the Invention

The present invention relates to automatic gain control circuits. More particularly, the present invention relates to a novel and improved closed loop automatic gain control gain control circuit with linear gain control over a very high dynamic range.

II. Description of the Related Art

Automatic gain control (AGC) circuits are widely used in receivers for controlling the gain applied to a signal to be processed. In both analog and digital signal receivers AGC circuits are implemented using different techniques. In analog receivers analog techniques are commonly used while in digital receivers, digital techniques are applied.

In analog receivers, such as used in narrowband FM cellular telephones, the power of the received signal is merely limited typically by clipping the signal. However, such an analog signal processing technique is not applicable to digital receivers since a clipping of a signal modulated with digital data would result in corruption of the data.

Typically in digital receivers, the level of signal power is detected, digitized and then measured. The measured value is typically compared with a set value and an error value generated, all values being in digital form. The error value is then used to control the gain of an amplifier so as to adjust the signal strength to coincide with the desired signal power.

Digital AGC techniques however are relatively slow in controlling signal power due to saturation of the error signals involved in actually controlling the power. Digital techniques thus have the disadvantage of failing to provide accurate power control in environments where signal strength is rapidly changing, and particularly over a high dynamic range.

It is therefore an object of the present invention to provide a novel and improved AGC circuit for rapid, high dynamic range signal power control.

It is yet another object of the present invention to provide an AGC circuit capable of providing gain control over both wideband and narrowband signals so as to maintain received signal power at a constant level.

It is still a further object of the present invention to provide an AGC circuit capable of providing a control signal which can be used in controlling transmitter power.

SUMMARY OF THE INVENTION

The present invention is a novel and improved closed loop automatic gain control circuit which utilizes low cost analog circuitry to measure and control signal power of a received RF signal. In applications where the signal of interest is either a wideband signal, such as a CDMA signal containing digital information, or a narrowband signal, such as an FM signal containing analog information, the circuitry of the present invention is capable of providing the necessary gain control.

In accordance with the present invention a closed loop automatic gain control (AGC) circuit having high dynamic range capabilities is disclosed. The AGC circuit is comprised of an amplifier means for receiving an input signal which is susceptible to variations in signal power. The amplifier means also receives a control signal and is responsive to the control signal for amplifying the input signal at a gain level in dB as a linear function of a control signal and providing a corresponding output signal. Measurement means is coupled to the amplifier means for measuring logarithmic signal power of the input signal and providing a corresponding linear measurement signal in response to input signal power variations in dB. Integration means is included for receiving the measurement signal, and a reference signal which corresponds to a desired signal power of the output signal. The integration means integrates over time the difference between the measurement signal and the reference signal, and generates the control signal corresponding to the result of the integration.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In a digital receiver, such as used in a code division multiple access (CDMA) mobile cellular telephone, it is necessary to limit the power of the received signal for proper signal processing of the received signal. In the cellular environment, a digital receiver may receive a signal which experiences rapid and wide variations in signal power. In order to properly process the digital data contained within the received signal the signal power must be limited. Accordingly, a closed loop automatic gain control circuit for a digital receiver is disclosed which is capable of limiting received signal power in such an environment.

Figure 1:
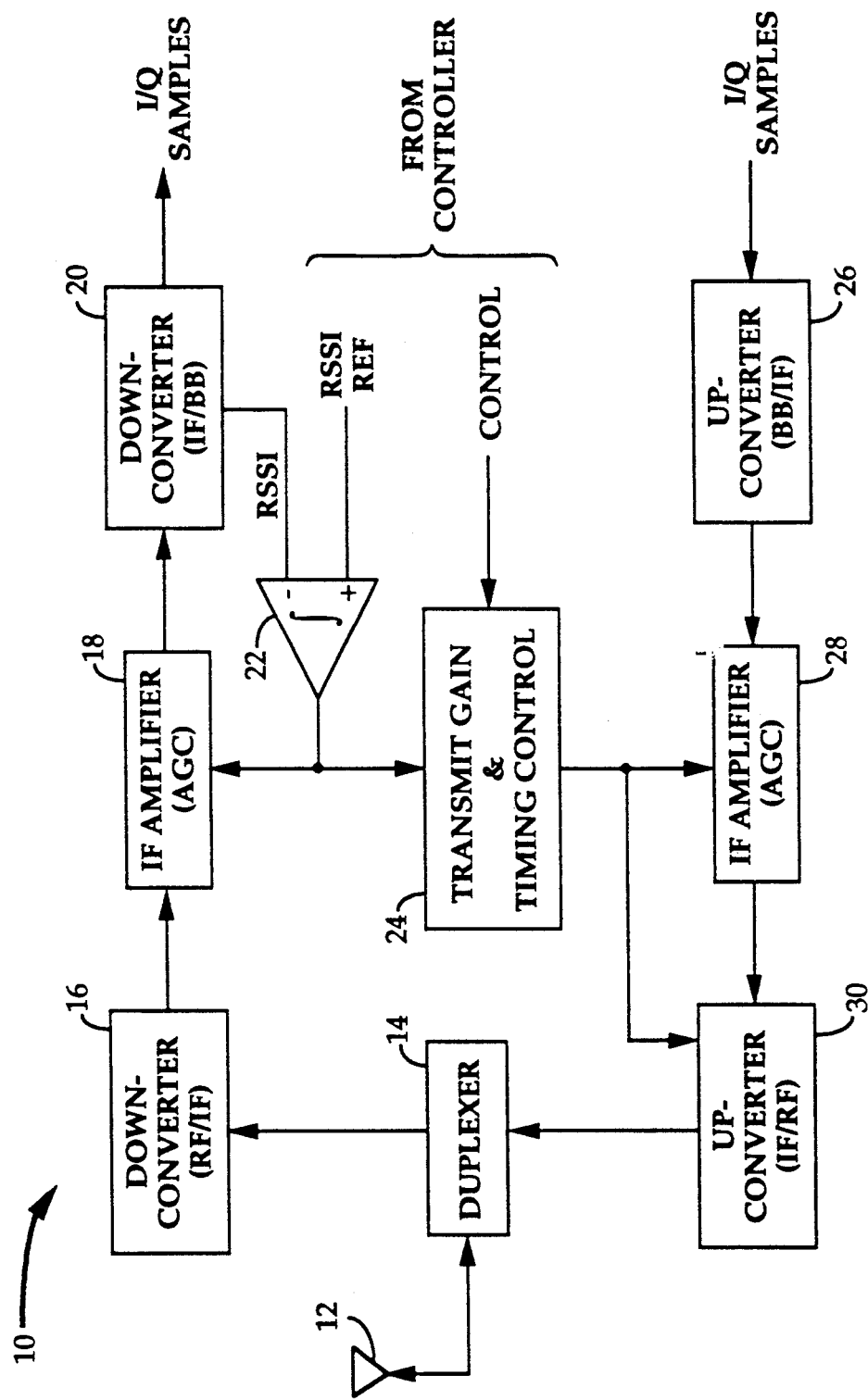
FIG. 1 is a block diagram illustrating in an exemplary application the elements of the closed loop automatic gain control circuit of the present invention.

FIG. 1 illustrates in block diagram form an exemplary application of the closed loop automatic gain control circuit of the present invention. In FIG. 1, the closed loop automatic gain control circuit is implemented in the transceiver of a CDMA mobile cellular telephone 10. It is envisioned that telephone 10 may be exclusively CDMA compatible or of a dual mode, i.e. CDMA and conventional FM compatible. The closed loop automatic gain control circuit of the present invention is capable of providing power limiting of both wideband CDMA signals and narrowband FM signals. The compatibility of such circuitry to operate on both wideband and narrowband signals provides cost, component and power savings for the receiver.

Telephone 10 includes antenna 12 for receiving transmitted RF signals, including CDMA or FM communication signals, transmitted from a base station that are intended for reception and processing by mobile telephone 10. Antenna 12 couples the received signals to duplexer 14 which provides the received signals to the receiver portion of telephone 10. Duplexer 14 also receives CDMA or FM communication signals from the transmitter portion of telephone 10 for coupling to antenna 12 for transmission to a base station.

The received signals are output from duplexer 14 to downconverter 16 where the RF signals are converted to a lower frequency range and are provided as corresponding IF signals. The IF signals from downconverter 16 are provided to automatic gain controlled IF amplifier 18. The IF signals are amplified at a gain level determined by an AGC signal also provided to amplifier 18. Amplifier 18 is capable of providing, in response to the AGC signal, linear control of gain in dB over a high dynamic range, such as in excess of 80 dB. Amplifier 18 is preferably of a design described in a copending U.S. patent application entitled "LINEAR GAIN CONTROL AMPLIFIER", Ser. No. 07/598,845, filed Oct. 15, 1990, and assigned to the Assignee of the present invention.

The gain controlled IF signals are output from amplifier 18 to a second frequency downconverter, downconverter 20, where the IF signals are converted to a lower frequency range and provided as corresponding user baseband signals. In the embodiment shown in FIG. 1, the baseband signals in the CDMA mode of operation are I and Q samples of encoded digital data which are output for further demodulation and correlation. In a dual mode receiver, downconverter 20 also frequency downconverts and demodulates the FM signals so as to provide an audio signal output.

Downconverter 20 also includes the capability of measuring the strength of the signal received by telephone 10 and generating a corresponding received signal strength indication (RSSI) signal. The RSSI signal along with a RSSI reference signal are provided to integrator 22. The RSSI reference signal is generated by a controller (not shown) and corresponds to a desired signal strength level for the IF signals output from amplifier 18. Integrator 22 generates the AGC signal that is input to amplifier 18 for gain control.

Downconverter 20 enables the use of an analog gain control technique for a digital signal impressed upon a carrier signal, unlike the gain control techniques typically used in digital receivers. In particular, downconverter 20 performs an analog measurement of RF power in the received signal and provides a corresponding RSSI signal. The RSSI signal is a signal which varies linearly with respect to measured log power. This analog power measurement is used to provide control over the power in the received wideband signal so as to maintain the signal, as output for digital signal processing, at a constant power level. Similarly when the received signal is a narrowband signal the power is also maintained at a constant level.

Integrator 22 receives the RSSI signal from downconverter 20 along with the RSSI reference signal. In order to provide accurate power control, is necessary for the error between the RSSI signal (indicative of the measured power level) and the RSSI reference signal (indicative of the desired power level) to be eliminated. Integrator 22 is used to provide this function in the AGC loop by forcing the error to zero. For example, if the gain of the signal is too high, the RSSI signal will also be high as compared to the RSSI reference signal. Until the two input signals to integrator 22 are identical, the integrator output signal will continue to go up resulting in a reduction of the gain of amplifier 18.

It should be understood that the RSSI measurement can be made at various points in the processing of the received signal. Although illustrates in FIG. 1 that the measurement is made in downconverter 20, and at an IF frequency, the measurement can be made in downconverter 16 or at any other point in the signal processing at either an RF or IF frequency.

The use of analog techniques in wideband signal power control provides for a reduction in hardware required for a dual mode telephones. As mentioned previously, in a dual mode telephone wideband and narrowband signal power must be provided for the CDMA signal and the FM signal. In using analog power control techniques for both the wideband and narrowband signals, the same power control circuitry can be used for both modes of operation.

Analog power control techniques provide a faster response to variations in signal power than conventional digital power control techniques. In using analog power control techniques to control a signal power of a wideband signal containing digital data, signal power can be controlled at a faster rate than using conventional digital power control techniques. The exemplary implementation of the AGC loop of the present invention does not limit dynamic errors so as to achieve fast control of gain over a range of 100 dB.

Furthermore, in this embodiment, where a linear control and measurement circuit (linear with respect to voltage vs. dBm) is used, loop bandwidth is independent of signal power. Loop bandwidth is held constant since the gain of each element in the loop is constant over a wide range of signal variations.

With respect to the transmitter portion of telephone 10, transmit power is also controlled. The AGC signal is again used to provide instantaneous control of transmit power. The AGC signal is provided to the transmitter portion, along with various other control signals from the controller. In utilizing the AGC signal to also control transmit power, the transmitter gain is adjusted with respect to the receiver gain so that the transmitter gain tracks the receiver gain.

In the transmission of CDMA communication signal from telephone 10 to a base station, the transmitter portion of telephone 10 is provided with user baseband signals, typically I and Q samples of encoded digital data in the single mode telephone. In the dual mode telephone, I and Q samples, or FM signals would be provided as the user baseband signals. The I and Q samples, or FM signals, are provided as an input to upconverter 26 where these baseband signals are converted in frequency to a higher frequency range and provided as IF signals. The IF signals are then provided to IF amplifier 28 where amplified at a level determined by the AGC signal provided through logic 24.

The amplified IF signals are provided to upconverter 30 where they are converted in frequency to a higher frequency range and provided as RF signals. Upconverter 30 also includes an amplifier and receives signals from logic 24 for controlling the gain of the RF signals output therefrom. The RF signals are then provided to duplexer 14 which couples the signals to antenna 12 for transmission.

It is to be noted that the application of the same AGC signal which controls the receiver gain to IF amplifier 28 provides an advantage to the telephone operation. The use of the AGC signal by the transmitter permits the transmitter gain to track receiver gain. For example, as the received signal increases in signal strength, less transmission signal power is needed to maintain communications from the telephone to the base station. Accordingly, with the receiver ACG circuit forcing a decrease in gain for the received signal, the transmission gain is correspondingly decreased.

Figure 2A:
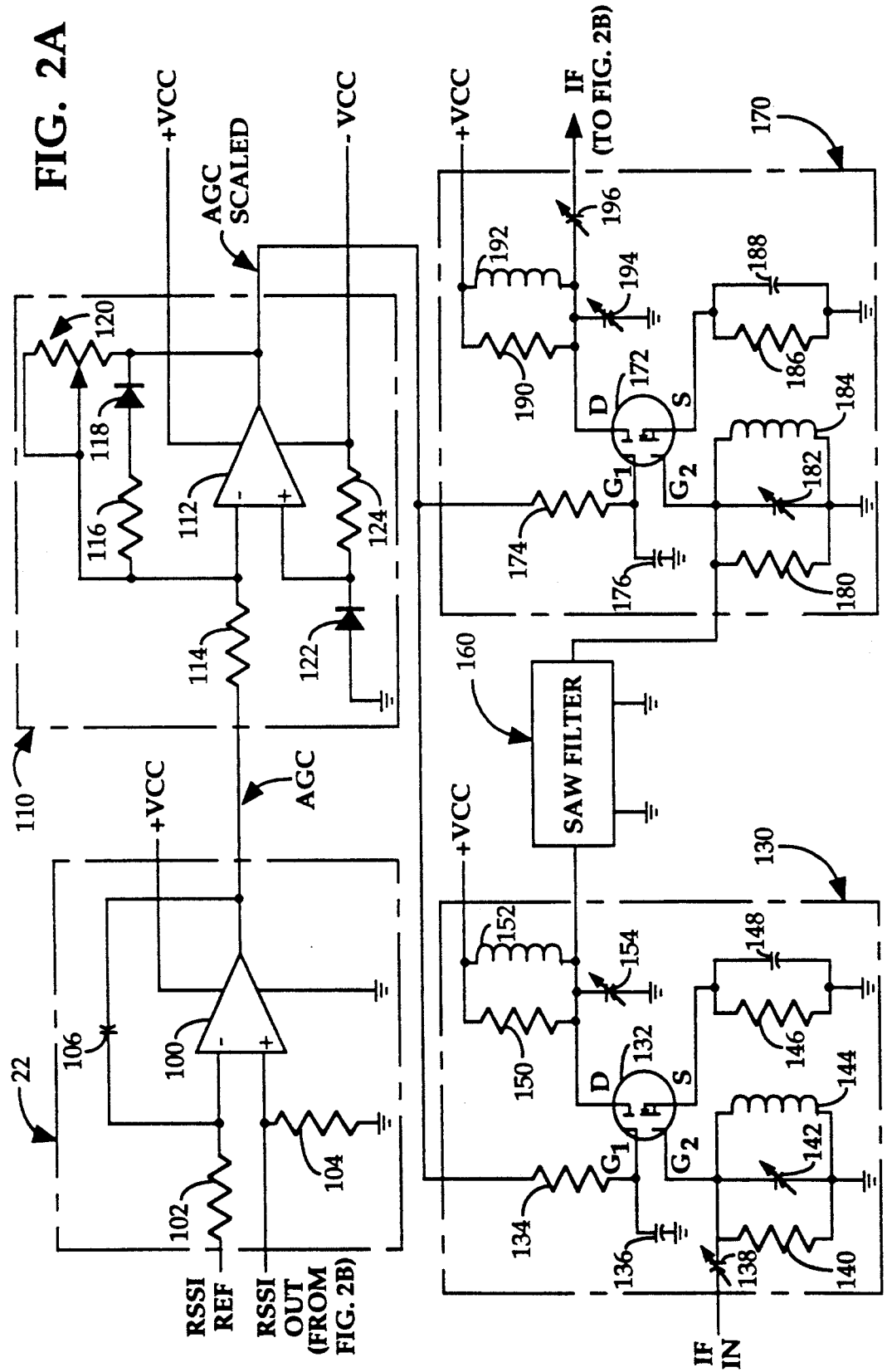
FIGS. 2A and 2B illustrate in schematical form an exemplary embodiment of the closed loop automatic gain control circuit of FIG. 1.
Figure 2B:
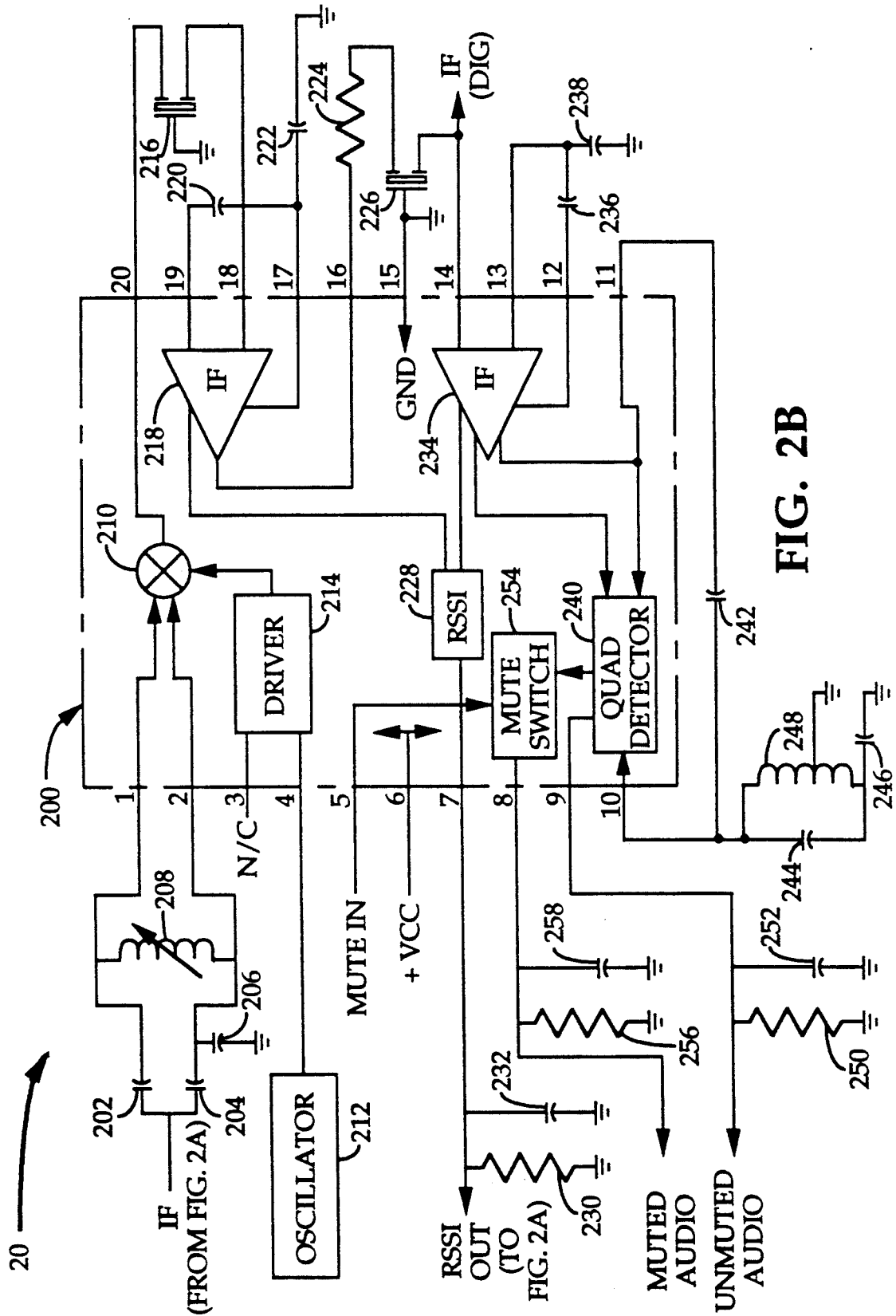

Turning now to FIGS. 2A and 2B illustrated therein is further details of the exemplary embodiment of the closed loop automatic gain control circuit of FIG. 1 as implemented in the receiver portion of telephone 10. FIGS. 2A and 2B in particular illustrate amplifier 18, downconverter 20 and integrator 22 as main elements of the closed loop.

In FIG. 2A, integrator 22 is comprised of an operational amplifier, op amp 100, having a feedback network to configured to such that op amp 100 functions as an integrator. In particular, op amp 100 receives the RSSI reference signal through resistor 102 at its inverting input. The RSSI out signal (described in further detail below) is input to the noninverting input of op amp 100, while the noninverting input is also coupled to ground through resistor 104. The output of op amp 100 is coupled to the inverting input of op amp 100 through capacitor 104. Integrator 22 produces an output voltage which is proportional to the integral, i.e. the product of the amplitude and duration, of the difference between the RSSI reference signal and the RSSI out signal. The RSSI reference signal being indicative of a desired signal strength while the RSSI out signal is indicative of measured signal strength. The output signal from op amp 100 is an uncompensated AGC signal that is coupled as an input to IF amplifier 18.

IF amplifier 18 is comprised of compensation circuit 110, amplifier circuit 130, filter 160 and amplifier circuit 170. Compensation circuit 110 receives the AGC signal and in response thereto generates a compensation signal, AGC SCALED, which compensates for nonlinearities in gain control over the dynamic range of amplifier circuits 130 and 170. The compensation signal is output from compensation circuit 110 to both amplifier circuits 130 and 170.

Amplifier circuit 130 receives and amplifies an input IF signal at a gain level determined by the AGC SCALED signal. The amplified IF signal is then output to filter 160 where it is bandpass filtered and output to amplifier circuit 170. Amplifier circuit 170 receives the amplified and filtered IF signal where amplified at a gain level determined by the compensation signal. The amplified IF signal is then output from amplifier circuit 170 for further processing.

Compensation circuit 110 is comprised of an operational amplifier, op amp 112, which has an inverting input coupled to receive the AGC signal through input resistor 114. The inverting input is also coupled to the output of op amp 112 through a nonlinear feedback circuit comprised of series coupled resistor 116 and diode 118 which are coupled in parallel with variable resistor 120. The noninverting input of op amp 112 is provided with a reference or bias voltage across diode 122 that is provided through resistor 124 from the supply voltage −VCC. Resistors 114, 116 and 124 are typically of the same resistance, e.g., 10 KΩ value, while variable resistor 120 is capable of providing a much larger resistance value, e.g. 50 KΩ.

In the operation of compensation circuit 110, when the AGC SCALED signal voltage is below the bias voltage appearing at the noninverting input of op amp 112, the parallel resistance combination of resistor 116 and variable resistor 120, along with input resistor 114 ((R116||R120)/R114) sets a first slope gain curve for operation of op amp 112. When the AGC SCALED signal voltage is above the bias voltage, the value of variable resistor 120 along with input resistor 114 (R120/R114) sets a second, and different, gain curve for operation of op amp 112. Furthermore diodes 118 and 122 are preferably of the same type such that changes in temperature affecting diode 118, and thus the feedback, similarly affect diode 122 and the bias voltage. In the alternative, diode 122 may be replaced by a temperature sensitive element, such as a thermistor. It should be understood that the bias voltage appearing at the noninverting input of op amp 112 may be established at many different levels and by many different ways that are well known in the art.

The compensation signal generated by compensation circuit 110 is output from op amp 112 to both of amplifier circuits 130 and 170. Amplifier circuit 130 is typically comprised of dual gate FET amplifier 132 which has one gate ($G_1$) coupled through resistor 134 to the output of op amp 112 and through capacitor 136 to ground. The other gate ($G_2$) of FET 132 receives the input IF signal through variable capacitor 138, and is coupled to ground through the parallel combination of resistor 140, variable capacitor 142 and inductor 144. The source (S) of FET 132 is also coupled to ground through the parallel combination of resistor 146 and capacitor 148. The drain (D) of FET 132 is coupled to the supply voltage +VCC through the parallel combination of resistor 150 and inductor 152 while also being coupled to ground through variable capacitor 154. The drain (D) of FET 132 is coupled to the input of filter 160, which in the preferred embodiment is a surface acoustic wave (SAW) bandpass filter. SAW filter 160 typically has a center frequency at 70 MHz and a bandwidth of 1.25 MHz.

The voltage at gate ($G_1$) as determined by the output of op amp 112 controls the level of gain of FET 132. The input IF signal is amplified at the determined gain level by FET 132 with the output voltage appearing across the input transducer (not shown) of SAW filter 160. The parallel combination of resistor 150 and inductor 152 are of values selected such that, in combination with the output impedance of FET 132 appearing at the drain (D), the impedance of this circuit supplies the source impedance seen by SAW filter 160.

It may be shown that by using simple, tuned matching networks, the total insertion loss (IL) of the complete SAW filter is approximately:

$$IL = \left| \frac{2G_a G_s}{(G_a + G_s)^2} \right|^2 \quad (1)$$

where:
Ga is the real part of the acoustic admittance; and
Gs is the real part of the source and load admittances.
Also, it may be shown that the triple transit response (TTR) of the complete filter is defined by:

$$TTR = \left| \frac{2G_a G_s}{(G_a + G_s)^2} \right|^2 \cdot \left| \frac{G_a^2}{(G_a + G_s)^2} \right|^2 \quad (2)$$

Using the relationships set forth by equations (1) and (2), one can compute that for a triple transit response of 30 dB, relative to the main signal, an insertion loss of 12 dB can be achieved.

Amplifier circuit 170 is constructed in a manner similar to that of amplifier circuit 130. Amplifier circuit 170 is comprised of dual gate FET amplifier 172, preferably the same as FET 132, which has one gate ($G_1$) coupled through resistor 174 to the output of op amp 112 and through capacitor 176 to ground. The other gate ($G_2$) of FET 172 is coupled to the output of SAW filter 160 for receiving the filtered and amplified IF signal the output therefrom, and is coupled to ground through the parallel combination of resistor 180, variable capacitor 182 and inductor 184. The source (S) of FET 172 is also coupled to ground through the parallel combination of resistor 186 and capacitor 188. The drain (D) of FET 172 is coupled to the supply voltage +VCC through the parallel combination of resistor 190 and inductor 192 while also being coupled to ground through variable capacitor 194. The output of FET 172 is provided through variable capacitor 196 also coupled to the drain (D) of FET 172.

The voltage at gate ($G_1$), as determined by the output of op amp 112, again controls the level of gain of FET 172. The IF signal output from SAW filter 160 is amplified at the determined gain level by FET 172 with the output voltage appearing at the output of variable capacitor 196. The parallel combination of resistor 180 and inductor 182 are of values selected such that, in combination with the input impedance of FET 172 appearing at the gate ($G_2$), the impedance of this circuit provides the proper load for the output impedance of SAW filter 160.

The IF signal output from amplifier 170 is provided as an input to downconverter 20. In FIG. 2B, portions of downconverter 20 are illustrated in further detail. The IF signal is provided as an input to a mixer FM IF system 200 through a balanced input network comprised of capacitors 202, 204 and 206 and variable inductor 208. System 20 in the preferred embodiment is a high performance monolithic low power FM IF system incorporating a mixer/oscillator, two limiting intermediate frequency amplifiers, quadrature detector, muting, logarithmic received signal strength indicator (RSSI), and voltage regulator. Such a device is sold by Signetics Corporation of Sunnyvale, Calif. under Part No. NE/SA 605.

The input IF is provided through the balanced input network to two input ports of mixer 210. A third input port receives a lower frequency IF reference signal provided by oscillator 212 through driver 214. Mixer 210 mixes the IF signal with the IF reference signal to provide a lower frequency IF signal which is output therefrom to filter 216. Filter 216 is a bandpass filter, typically a crystal filter, with removes out of band frequencies from the IF signal. The filtered IF signal is output from filter 216 to an input of IF amplifier 218.

Amplifier 218 includes a decoupling network comprised of capacitors 220 and 222 coupled thereto for proper IF decoupling. Amplifier 218 amplifies the IF signal and provides the amplified IF signal as an output through resistor 224 to filter 226. Filter 226 is again a bandpass filter, also typically a crystal filter, which removes out of band frequencies from the IF signal. The filtered IF signal is output from filter 226 to an input of IF amplifier 228.

The filtered IF signal output from filter 226 is also provided as an output to digital signal processing hardware (not shown) for demodulation and correlation of I and Q samples of the encoded digital data of which the IF signal is comprised when the received signals are CDMA signals. It is further envisioned that the signal output from filter may be further mixed with a lower frequency signal and filtered (by components of downconverter 20 not shown) to provide the user baseband signal for digital processing.

Amplifier 218 also provides an output of the amplified IF signal to a logarithmic received signal strength indicator, RSSI 228, which accurately measures the power of the IF signal over a 90 dB range. RSSI 228 provides an output of a linear signal, RSSI OUT, indicative of measured logarithmic signal power. The output of RSSI 228 is coupled to resistor 102 the noninverting input of op amp 100 of integrator 22, while also being coupled to ground through parallel resistor 230 and capacitor 232. The RSSI OUT signal is thus provided as an output to integrator 22 where the AGC signal is generated as discussed above.

When telephone 10 is in the FM mode of operation, for dual mode telephones, the signal output from filter 226 is further processed as an FM signal and not a digital signal. The signal output from filter 226 is also coupled to an input of IF amplifier 234.

Filters 216 and 226 need to be wide passband filters for eliminating out of band frequencies in the CDMA mode of operation. However, additional filtering is required for the when telephone 10 is in the FM mode of operation. Thus, additional filters (not shown) need to be added to the filtering arrangement with these filters being of a narrow passband tuned to the designated RF channel to which telephone 10 is assigned for FM communications. It is envisioned that the additional filters would be selected from a bank of narrow passband filters in response to a filter selection signal corresponding to the FM channel of use. These additional filters may be switched into the circuit to provide additional filtering to that of filters 216 and 226, or having filters 216 and 226 switched out of the circuit with the appropriately selected additional filters from the bank of filters providing the necessary filtering.

Amplifier 234 also includes a decoupling network comprised of capacitors 236 and 238 coupled thereto for proper IF decoupling. Amplifier 234 amplifies the IF signal and provides the amplified IF signal as an output to quadrature detector 240. The other output of amplifier 234 is coupled to quadrature detector 240 and also AC coupled to a tuned quadrature network comprised of capacitors 242, 244, 246 and inductor 248. The output of quadrature detector 240 is coupled across parallel coupled resistor 250 and capacitor 252 as the audio signal, UNMUTED AUDIO.

Quadrature detector 240 also provides an output to mute switch 254. Mute switch 254 also has an input for receiving a control signal, MUTE IN, which controls whether the audio output therefrom is muted or unmuted. The output of mute switch 254 is coupled across parallel coupled resistor 256 and capacitor 258 as the audio signal, MUTED AUDIO.

It can be seen from the FIGS. 2A and 2B, analog circuitry may be used to provide closed loop automatic gain control in the processing of both analog (FM) and digital (CDMA) signals. Such a circuit implementation eliminates the necessity to have both analog and digital circuitry in a dual mode signal processing environment. Furthermore, the use of analog techniques in gain control of digital signals provides for faster gain control than over conventional techniques.

The circuit of the present invention provides for a low cost, low power implementation of an automatic gain control circuit for various radio designs. Having accurate measurement of signal strength and linear control over gain over a relatively large bandwidth, typically in excess of 80 dB, the circuit is particularly applicable to the CDMA cellular environment where gain control is a critical element in the CDMA telephone. The advantages of the present invention overcome many of the deficiencies of other techniques for gain control, particularly those experienced in the cellular telephone environment.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A linear closed loop automatic gain control (AGC) circuit comprising:
   amplifier means for receiving an input signal which is susceptible to variations in signal power, receiving a control signal, amplifying said input signal at a gain level in dB as a linear function of said control signal and providing a corresponding amplifier means output signal wherein said amplifier means comprises:
   input amplification means for, receiving said input signal and said control signal, amplifying said input signal at an input gain level in dB as a linear function of said control signal and providing a corresponding input amplification means output signal;
   filter means for receiving and filtering said input amplification means output signal; and
   output amplification means for, receiving said filtered input amplification means output signal and said control signal, amplifying said filtered input amplification means output signal at an output gain level in dB as a linear function of said control signal and providing a corresponding output amplifier means output signal;
   measurement means coupled to said amplifier means for measuring logarithmic signal power of said amplifier means output signal and providing a corresponding linear measurement signal; and
   integration means for receiving said measurement signal and a reference signal, integrating a difference between said measurement signal and said reference signal, and providing as a result of said integration said control signal.

2. The circuit of claim 1 wherein said measurement means comprises a received signal strength indicator circuit having an input coupled to said amplifier means and an output coupled to said integration means.

3. The circuit of claim 1 wherein said integration means comprises:
   an op amp having a noninverting input coupled to said measurement means and an inverting input for receiving said reference signal, and an output; and
   a capacitive feedback network coupled between said op amp output and inverting input.

4. A method for providing linear closed loop automatic gain control over a high dynamic range comprising the steps of:
   amplifying an input signal at a gain in dB as a linear function of a control signal, said step of amplifying of said input signal comprising the steps of:
   receiving said input signal;
   receiving said control signal;
   amplifying said input signal at a first gain level in dB as a linear function of said control signal;
   providing a first amplified signal corresponding to said first gain level amplified input signal;
   filtering said first amplified signal;
   amplifying said filtered first amplified signal at a second gain level in dB as a linear function of said control signal; and
   providing an output signal corresponding to said second gain level amplified filtered first amplified signal;
   measuring log signal power of said output signal;
   providing a linear measurement signal corresponding to measured log signal power of said output signal;
   integrating with respect to time a difference between said measurement signal and a reference signal; and
   providing as a result of integrating said control signal.

5. The method of claim 4 wherein said step of filtering comprises bandpass filtering said first amplified signal.

6. The circuit of claim 1 wherein said reference signal corresponds to a desired signal power of said amplifier means output signal.

7. An automatic gain control circuit comprising:
   variable gain amplifier means for receiving an input signal and a control signal, amplifying said input signal in dB as a linear function of said control signal, wherein said variable gain amplifier means comprises:
   first amplifier means for receiving said input signal and said control signal, amplifying said input signal at a gain in dB as a linear function of said control signal and providing a resultant first output signal;
   filter means for receiving and filtering said first output signal; and
   second amplifier means for, receiving said filtered first output signal and said control signal, amplifying said input signal at a gain in dB as a linear function of said control signal and providing a resultant second output signal as said variable gain amplifier means output signal;
   measurement means coupled to said variable gain amplifier means for measuring logarithmic signal power of said variable gain amplifier means output signal and providing a corresponding linear measurement signal; and
   integrator means for receiving said measurement signal and a reference signal, integrating with respect to time a difference between said measurement signal and said reference signal, and providing said control signal.

8. The circuit of claim 7 wherein said measurement means comprises a received signal strength indicator circuit having an input coupled to said second amplifier means and an output coupled to said integrator means.

9. The circuit of claim 8 wherein said integration means comprises:
   an op amp having a noninverting input coupled to said received signal strength indicator circuit output and an inverting input for receiving said reference signal, and an output; and a capacitive feedback network coupled between said op amp output and inverting input.

10. A closed loop automatic gain control (AGC) circuit comprising:

a variable gain amplifier having a gain control input, a signal input, and an output, said amplifier having a linear gain control region wherein when a gain control signal within a predetermined range is applied to said gain control input, gain in dB of said amplifier a linear function of said gain control signal and providing an amplifier output signal;

a power detector having an input coupled to said amplifier output and an output, said power detector providing a power detector output signal which varies linearly with power in dB of said amplifier output signal; and an integrator having a pair of inputs and an output, one of said integrator inputs coupled to said power detector output, another one of said integrator inputs for receiving a reference signal, and said integrator output coupled to said gain control input of said amplifier, wherein said integrator generates said gain control signal and when said gain control signal is within said predetermined range said gain control signal directly controls said amplifier gain.

11. The AGC circuit of claim 10 further comprising:

an additional variable gain amplifier disposed between said amplifier and said power detector, said additional amplifier having a signal input coupled to said amplifier output, a gain control input coupled to said integrator output and an output coupled to said power detector input, said additional amplifier also having a linear gain control region wherein when a gain control signal within a predetermined range is applied to said additional amplifier gain control input gain in dB of said additional amplifier is a linear function of said control signal and providing an additional amplifier output signal.

12. The AGC circuit of claim 11 further comprising:

a filter disposed between said amplifier and said additional amplifier, said filter having an input coupled to said amplifier output and an output coupled to said additional amplifier input.

13. The AGC circuit of claim 10 wherein said integrator comprises:

an op amp having a noninverting input coupled to said power detector output, and an inverting input for receiving said reference signal, and an output coupled to said amplifier gain control input; and a capacitive feedback network coupled between said op amp output and said inverting input.

14. The AGC circuit of claim 11, wherein said integrator comprises:

an op amp having a noninverting input coupled to said power detector output, and an inverting input for receiving said reference signal, and an output coupled to said amplifier gain control input and said additional amplifier gain control input; and a capacitive feedback network coupled between said op amp output and said inverting input.

15. The AGC circuit of claim 12 wherein said integrator comprises:

an op amp having a noninverting input coupled to said power detector output, and an inverting input for receiving said reference signal, and an output coupled to said amplifier gain control input and said additional gain gain control input; and a capacitive feedback network coupled between said op amp output and said inverting input.

* * * * *